United States Patent
Iwasa et al.

(10) Patent No.: US 8,575,934 B2
(45) Date of Patent: Nov. 5, 2013

(54) MAGNETIC RESONANCE IMAGING APPARATUS AND SHIMMING APPARATUS WITH CONVEX TO CONCAVE LAYERED STACKING OF SHIM PLATES

(75) Inventors: Masateru Iwasa, Yokohama (JP); Yoshitomo Sakakura, Nasushiobara (JP); Kazuto Nogami, Nasushiobara (JP); Hidekazu Tanaka, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 520 days.

(21) Appl. No.: 12/833,495

(22) Filed: Jul. 9, 2010

(65) Prior Publication Data

US 2011/0006769 A1  Jan. 13, 2011

(30) Foreign Application Priority Data

Jul. 9, 2009  (JP) ................. 2009-162786

(51) Int. Cl.
*G01R 33/3873* (2006.01)
*G01R 33/3875* (2006.01)

(52) U.S. Cl.
USPC .......................... 324/318; 324/320; 324/321

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 5,773,976 A | 6/1998 | Sakakura et al. | 324/318 |
| 6,259,252 B1 * | 7/2001 | Laskaris et al. | 324/319 |
| 6,333,630 B1 * | 12/2001 | Holsinger et al. | 324/319 |
| 6,634,088 B1 * | 10/2003 | Morrone | 29/607 |
| 6,700,378 B2 * | 3/2004 | Sato | 324/318 |
| 6,867,592 B2 * | 3/2005 | Gebhardt et al. | 324/318 |
| 6,984,982 B2 | 1/2006 | Huang et al. | 324/318 |
| 7,071,694 B1 * | 7/2006 | Kruip | 324/323 |
| 7,508,209 B2 * | 3/2009 | Dietz et al. | 324/318 |
| 7,541,812 B2 | 6/2009 | Nogami | 324/319 |
| 7,884,605 B2 * | 2/2011 | Tamura et al. | 324/318 |
| 2002/0167320 A1 * | 11/2002 | Sato | 324/318 |
| 2003/0064507 A1 * | 4/2003 | Gallagher et al. | 435/287.2 |
| 2003/0206018 A1 * | 11/2003 | Gebhardt et al. | 324/318 |
| 2004/0150402 A1 | 8/2004 | Sakakura | 324/318 |
| 2006/0262826 A1 * | 11/2006 | Dietz et al. | 372/96 |
| 2009/0009171 A1 * | 1/2009 | Tamura et al. | 324/320 |
| 2009/0096453 A1 * | 4/2009 | Barnes et al. | 324/319 |
| 2010/0207630 A1 * | 8/2010 | Barnes et al. | 324/314 |
| 2011/0006769 A1 * | 1/2011 | Iwasa et al. | 324/309 |

FOREIGN PATENT DOCUMENTS

EP  1523016 A1  4/2005

OTHER PUBLICATIONS

Office Action dated Jul. 12, 2012 in CN Application No. 201010229492.3, only English of p. 4.

* cited by examiner

*Primary Examiner* — Melissa Koval
*Assistant Examiner* — Tiffany Fetzner
(74) *Attorney, Agent, or Firm* — Nixon & Vanderhye PC (57) ABSTRACT

According to one embodiment, a magnetic resonance imaging apparatus includes a static magnetic-field generating unit, a gradient magnetic-field generating unit, a plurality of metal shim plates in a plate shape, and a shim holding unit. The metal shim plates adjust uniformity of the static magnetic field. The shim holding unit holds the metal shim plates in a layered state. Each of the metal shim plates includes a convex having a certain angle at a certain position, and the metal shim plates are layered such that the convex of each one metal shim plate comes into contact with a back of the bent convex of another metal shim plate.

20 Claims, 6 Drawing Sheets

FIXING RECTANGLE

MAGNETIC RESONANCE IMAGING APPARATUS AND SHIMMING APPARATUS WITH CONVEX TO CONCAVE LAYERED STACKING OF SHIM PLATES

CROSS-REFERENCE TO RELATED APPLICATIONS

This application is based upon and claims the benefit of priority from Japanese Patent Application No. 2009-162786, filed on Jul. 9, 2009; the entire contents of which are incorporated herein by reference.

FIELD

Embodiments described herein relate generally to a magnetic resonance imaging apparatus and a shimming apparatus.

BACKGROUND

A magnetic resonance imaging apparatus is an apparatus that images an inside of a subject by using a magnetic resonance phenomenon. Such magnetic resonance imaging apparatus includes a static magnetic-field magnet that generates a static magnetic field in an imaging area, a gradient magnetic-field coil that applies a gradient magnetic field onto a subject placed in the static magnetic field, and a radio frequency coil that receives a magnetic resonance signal from the subject applied with the gradient magnetic field.

Some of conventional magnetic resonance imaging apparatuses include a shimming unit for correcting ununiformity of a static magnetic field in an imaging area. As an example of such shimming unit, a technology that uses, for example, metal shims formed in a plate shape, is proposed (for example, see JP-A H8-299304 (KOKAI)). According to the conventional technology, ununiformity of a static magnetic field is corrected by stacking in layers and arranging a certain number of metal shims at respective positions in the vicinity of a static magnetic-field magnet.

However, according to the conventional technology described above, the metal shims provided on a gradient magnetic-field coil sometimes move in some cases, resulting in a problem that noise appears on an image due to the movement of the metal shims.

Specifically, while imaging, when a gradient magnetic field is generated by the gradient magnetic-field coil, an eddy current is induced in the metal shims. When a plurality of metal shims is provided, a potential difference arises between each of the metal shims due to the eddy current. In such state, for example, if relative positions of the respective metal shims are changed due to vibration of the gradient magnetic-field coil, as respective metal surfaces are brought close to each other, a weak discharge phenomenon occurs at ends of the metal shims. The discharge phenomenon causes a pop noise, and the pop noise causes noise to appear on a taken image.

DETAILED DESCRIPTION

Exemplary embodiments of a magnetic resonance imaging apparatus and a shimming apparatus will be explained below in detail with reference to the accompanying drawings.

According to one embodiment, a magnetic resonance imaging apparatus includes a static magnetic-field generating unit, a gradient magnetic-field generating unit, a plurality of metal shim plates, and a shim holding unit. The metal shim plates adjust uniformity of the static magnetic field. The shim holding unit holds the metal shim plates in a layered state. Each of the metal shim plates includes a convex having a certain angle at a certain position, and the metal shim plates are layered such that the convex of each one metal shim plate comes into contact with a back of the convex of another metal shim plate.

The following embodiments are explained below in cases of using iron shims as metal shim plates. Hereinafter, a magnetic resonance imaging apparatus is referred to as an MRI apparatus.

Figure 1:
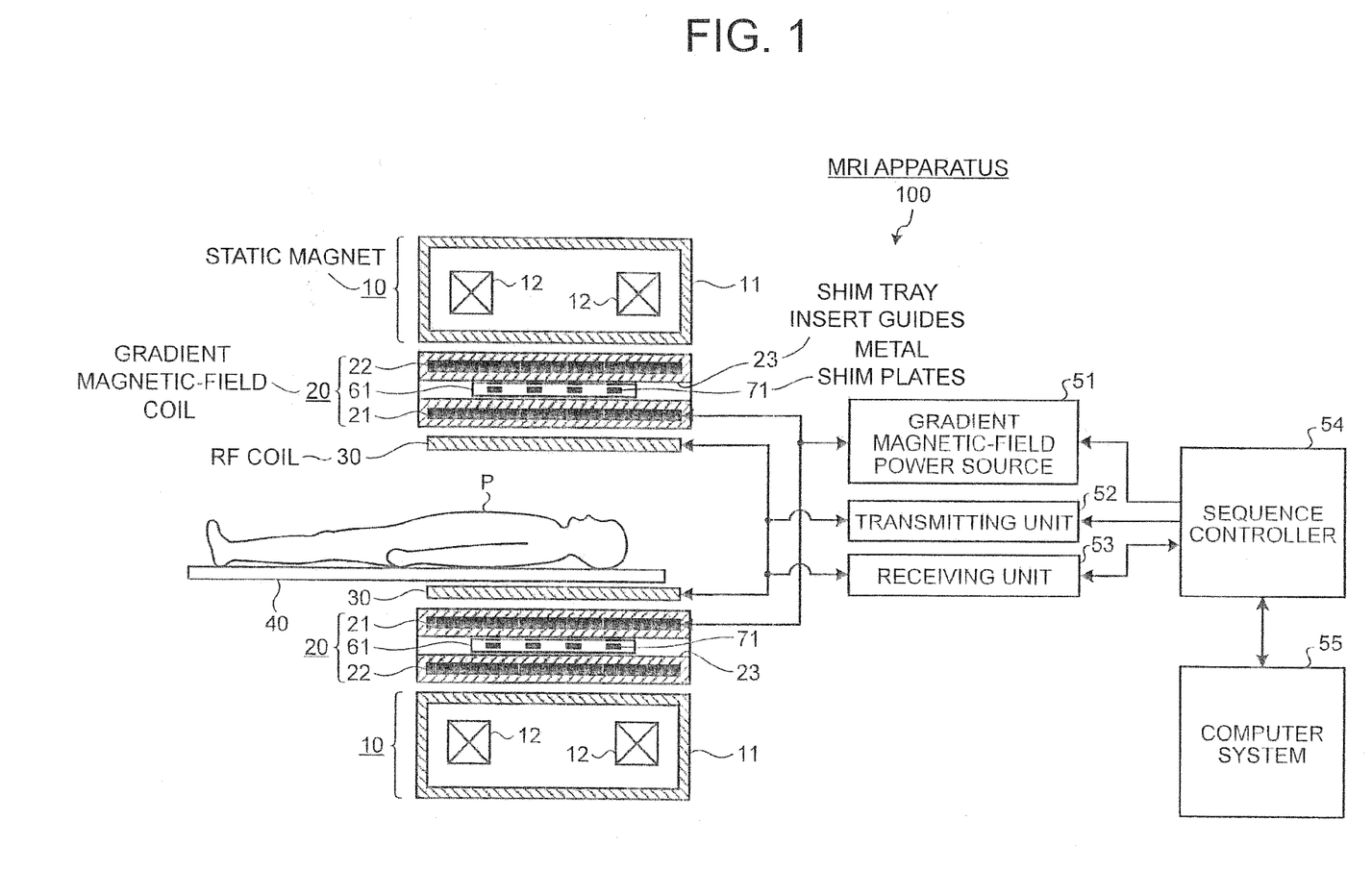
FIG. 1 is a configuration diagram that depicts a configuration of a Magnetic Resonance Imaging (MRI) apparatus according to an embodiment.

First of all, a configuration of an MRI apparatus 100 according to an embodiment is explained below. FIG. 1 is a configuration diagram that depicts a configuration of the MRI apparatus 100 according to the embodiment. As shown in FIG. 1, the MRI apparatus 100 includes a static magnetic-field magnet 10, a gradient magnetic-field coil 20, a Radio Frequency (RF) coil 30, a top plate 40, a gradient magnetic-field power source 51, a transmitting unit 52, a receiving unit 53, a sequence controller 54, and a computer system 55.

The static magnetic-field magnet 10 includes a vacuum container 11 in a substantial drum shape, and superconducting coils 12 that are immersed in a cooling liquid in the vacuum container 11; and generates a static magnetic field inside a bore (a space inside the drum of the static magnetic-field magnet 10), which is an imaging area.

The gradient magnetic-field coil 20 is formed in a substantial drum shape, and fixed on the inner side of the static magnetic-field magnet 10. The gradient magnetic-field coil 20 includes a main coil 21 that applies gradient magnetic fields in directions of the x-axis, the y-axis, and the z-axis with a current supplied from the gradient magnetic-field power source 51; and a shield coil 22 that cancels a leakage magnetic field from the main coil 21.

Shim-tray insert guides 23 are formed between the main coil 21 and the shield coil 22. A shim tray 61 accommodating therein iron shims 71 for correcting ununiformity of a magnetic field inside the bore is inserted in each of the shim-tray insert guides 23. A structure of the gradient magnetic-field coil 20 will be explained later in detail.

The RF coil 30 is anchored on the inner side of the gradient magnetic-field coil 20 on opposite sides of a subject P. The RF coil 30 radiates a RF pulse transmitted from the transmitting unit 52 onto the subject P, and receives a magnetic resonance signal emitted from the subject P by excitation of hydrogen nuclei.

The top plate 40 is provided on a not-shown bed in a movable manner in the horizontal direction; and when performing a scan, the subject P is placed on the top plate 40, and then the top plate 40 is moved into the bore. The gradient magnetic-field power source 51 supplies power to the gradient magnetic-field coil 20 based on an instruction from the sequence controller 54.

The transmitting unit 52 transmits an RF pulse to the RF coil 30 based on an instruction from the sequence controller 54. The receiving unit 53 detects a magnetic resonance signal received by the RF coil 30, and transmits raw data obtained by digitizing the detected magnetic resonance signal, to the sequence controller 54.

The sequence controller 54 performs a scan of the subject P by activating the gradient magnetic-field power source 51, the transmitting unit 52, and the receiving unit 53, under the control of the computer system 55. As a result of performing a scan, when raw data is transmitted from the receiving unit 53, the sequence controller 54 transmits the raw data to the computer system 55.

The computer system 55 controls the whole of the MRI apparatus 100. Specifically, the computer system 55 includes an input unit that receives various input from an operator; a sequence control unit that causes the sequence controller 54 to execute a scan based on imaging conditions input by the operator; an image reconstructing unit that reconstructs an image based on raw data transmitted from the sequence controller 54; a storage unit that stores reconstructed images; a display unit that displays various information, such as a reconstructed image; and a main control unit that controls operation of each functional unit based on an instruction from the operator.

Figure 2:
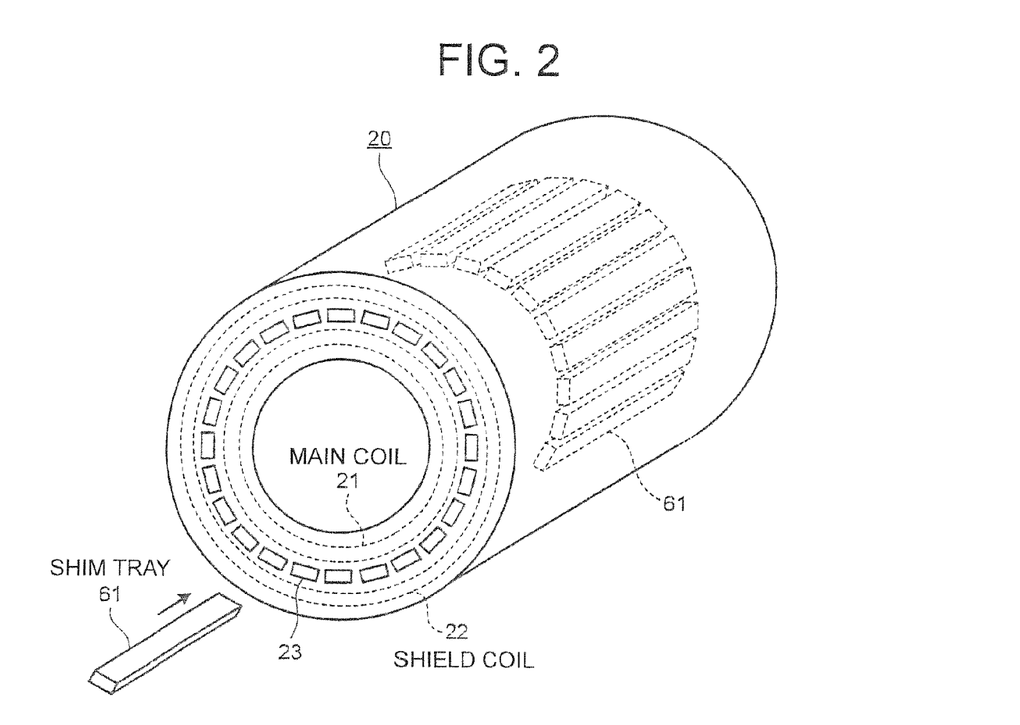
FIG. 2 is a perspective view that depicts a structure of a gradient magnetic-field coil according to the embodiment.

A structure of the gradient magnetic-field coil 20 shown in FIG. 1 is explained below. FIG. 2 is a perspective view of a structure of the gradient magnetic-field coil 20. As shown in the figure, the gradient magnetic-field coil 20 includes the main coil 21 and the shield coil 22, each of which is formed in a substantial drum shape; and a plurality of shim-tray insert guides 23 is formed between the main coil 21 and the shield coil 22.

Each of the shim-tray insert guides 23 is a through-hole that forms respective openings at the both ends of the gradient magnetic-field coil 20, and is formed along the whole length in the longitudinal direction of the gradient magnetic-field coil 20. The shim-tray insert guides 23 are formed so as to be in parallel with each other with regular intervals in the circumferential direction in a region between the main coil 21 and the shield coil 22. The shim tray 61 is inserted in each of the shim-tray insert guides 23, and each of the shim trays 61 is fixed in the center part of the gradient magnetic-field coil 20.

Figure 3:
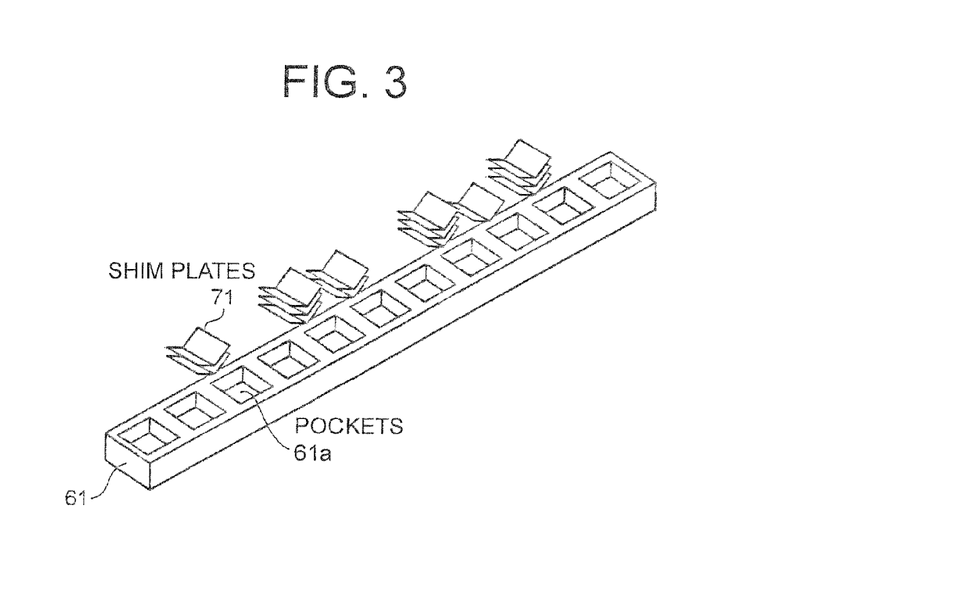
FIG. 3 is a perspective view that depicts details of a shim tray according to the embodiment.

The shim tray 61 is made from a resin that is a nonmagnetic and nonconductive material, and formed in a substantial stick shape, and has a length equivalent to the length of the gradient magnetic-field coil 20 excluding the both end parts. FIG. 3 is a perspective view that depicts details of the shim tray 61. As shown in the figure, the shim tray 61 includes a plurality of pockets 61a that is formed in series in the longitudinal direction of the shim tray 61. In each of the pockets 61a, a required number of the iron shims 71 are accommodated in a required position, in order to correct a static magnetic field in the middle section of the imaging area.

Figure 4:
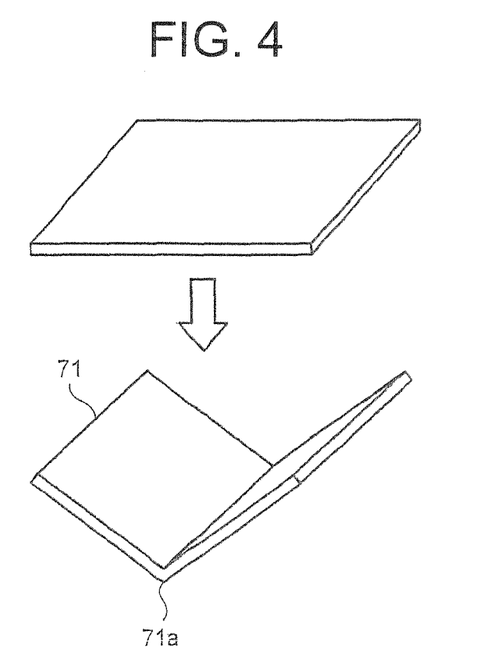
FIG. 4 is a perspective view that depicts details of an iron shim according to the embodiment.

The iron shim 71 is a member in a plate shape that adjusts the uniformity of a static magnetic field. FIG. 4 is a perspective view that depicts details of the iron shim 71. As shown in the figure, the iron shim 71 is made by bending it into a predetermined angle. In this way, the bent convex 71a is formed on the iron shim 71 by bending the iron shim 71. Although the embodiment is explained in a case where the iron shim 71 is formed by bending it into a V shape so as to have a single bent convex, it can be formed into, for example, a W shape, so as to have a plurality of bent convexes.

A shimming apparatus according to the embodiment includes the shim tray 61 and the iron shims 71.

Figure 5:
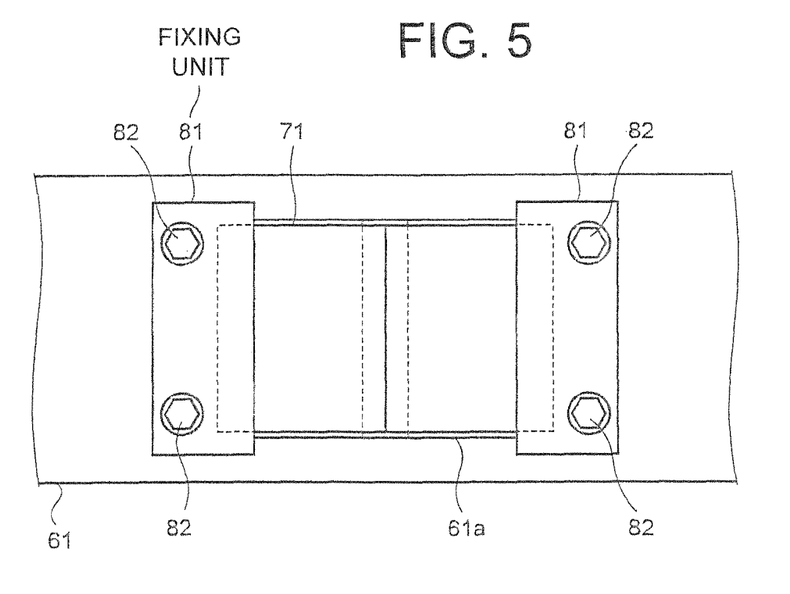
FIG. 5 is a top view that depicts a state of an iron shim fixed in a pocket of a shim tray according to the embodiment.
Figure 6:
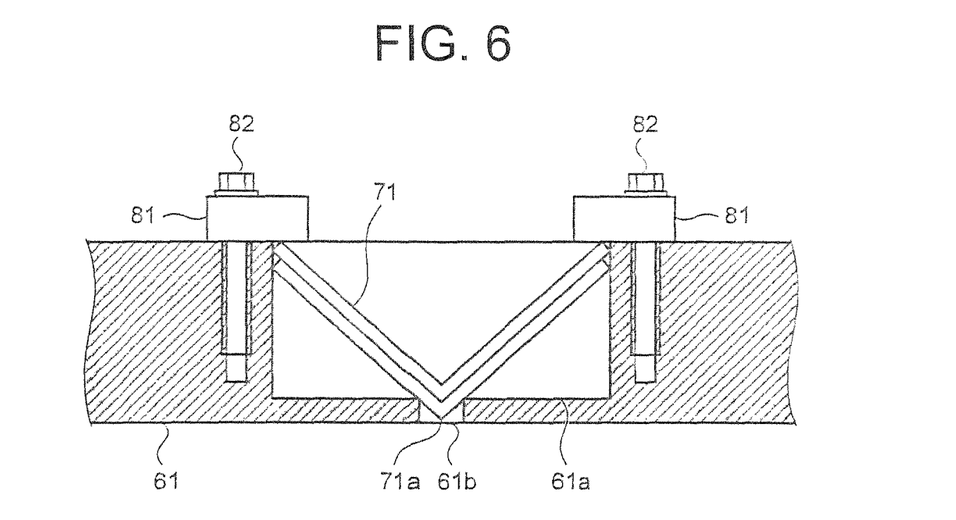
FIG. 6 is a side view that depicts a state of iron shims fixed in the pocket of the shim tray according to the embodiment.
Figure 7:
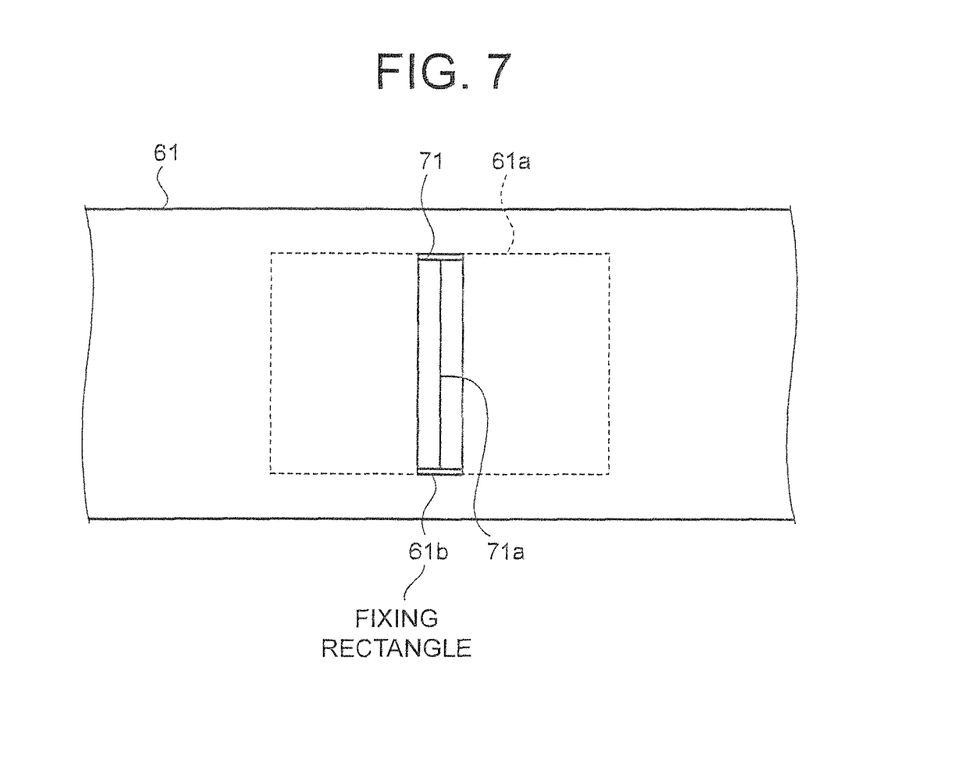
FIG. 7 is a bottom view that depicts a state of an iron shim fixed in the pocket of the shim tray according to the embodiment.

A method of fixing the iron shims 71 is explained below. FIG. 5 is a top view that depicts a state of the iron shim 71 fixed in the pocket 61a of the shim tray 61. FIG. 6 is a side view that depicts a state of the iron shims 71 fixed in the pocket 61a of the shim tray 61. FIG. 7 is a bottom view that depicts a state of the iron shim 71 fixed in the pocket 61a of the shim tray 61.

As shown in FIGS. 5 and 6, a certain number of the iron shims 71 are accommodated in the pocket 61a. FIGS. 5 and 6 depict a case where two of the iron shims 71 are accommodated in the pocket 61a as an example. As shown in FIGS. 5 and 6, a plurality of number of the iron shims 71 are layered and accommodated in the pocket 61a. Each of the iron shims 71 is layered such that the bent convex 71a included in one of the iron shims 71 comes into contact with the back of a bent convex included in another of the iron shims 71. Accordingly, a relative position of the iron shims 71 is fixed.

Furthermore, the iron shims 71 are fixed in a position in the vertical direction in the pocket 61a as the both ends in a layered state are held down from the upper side with two iron-shim fixing units 81. Each of the iron-shim fixing units 81 is anchored onto the shim tray 61 with two bolts 82.

As shown in FIG. 7, an iron-shim fixing concave 61b shaped as a rectangle is provided on the bottom of the pocket 61a. The iron-shim fixing concave 61b is formed to have a length substantially equal to the width of the iron shim 71 in a direction perpendicular to the longitudinal direction of the shim tray 61, and configured to engage with the bent convex 71a of the iron shim 71 positioned at the bottom when the iron shims 71 are accommodated. According to the iron-shim fixing concave 61b configured in this way, the position of the iron shims 71 can be fixed more securely. The number of the iron shims 71 that the pocket 61a can accommodate therein can be adjusted by changing the size of the iron-shim fixing concave 61b.

Figure 8:
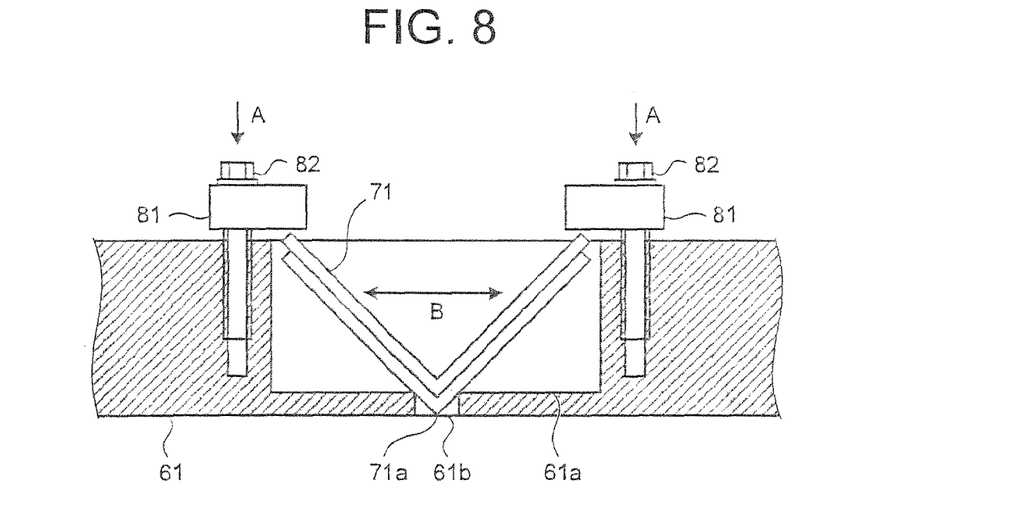
FIG. 8 is a schematic diagram for explaining a procedure until the iron shims according to the embodiment are fixed.

A procedure until the iron shims 71 are fixed as shown in FIGS. 5 to 7 is explained below. FIG. 8 is a schematic diagram for explaining a procedure until the iron shims 71 are fixed. As shown in the figure, to begin with, in a state that the iron-shim fixing units 81 are separated from the shim tray 61 by loosening the bolts 82, a certain number of the iron shims 71 are accommodated in the pocket 61a of the shim tray 61.

Suppose, as shown in FIG. 8, when the iron shims 71 are accommodated, the both ends of the iron shim 71 placed on the top project from the upper surface of the shim tray 61. In this state, by fastening the bolts 82, the iron-shim fixing units 81 move toward the shim tray 61. Accordingly, a force of pressing both ends of the iron shim 71 placed on the top in the direction of an arrow A in the figure is generated. With the force, each of the iron shims 71 is extended in the direction of an arrow B, so that the both ends of each of the iron shims 71 are pressed against the inner walls of the pocket 61a. Accordingly, the position of each of the iron shims 71 is fixed in the pocket 61a.

As described above, according to the embodiment, the MRI apparatus 100 includes a plurality of the iron shims 71 in a plate shape that adjusts the uniformity of a static magnetic field, and the shim tray 61 that holds the iron shims 71 in a layered state. The iron shims 71 each include the bent convex 71a formed by bending it at a certain position into a certain angle, and are layered such that the bent convex 71a included in one iron shim comes into contact with the back of the bent convex 71a included in another iron shim. Consequently, according to the embodiment, a relative position of each of the iron shims 71 is fixed, so that movement of the metal shim plates can be suppressed, and noise appearing on an image can be reduced.

Figure 9:
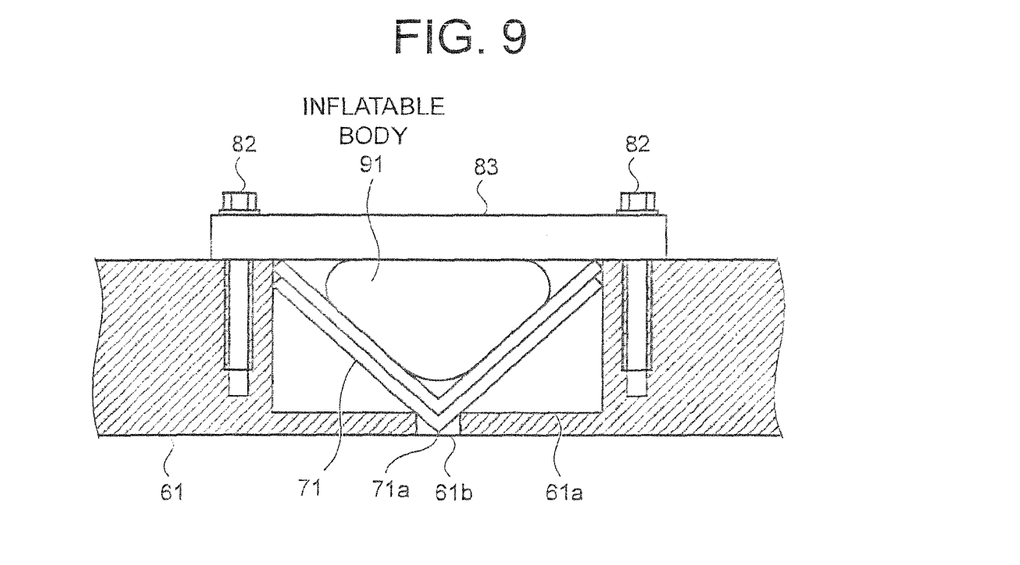
FIGS. 9 and 10 are schematic diagrams for explaining modifications of the magnetic resonance imaging apparatus according to the embodiment.
Figure 10:
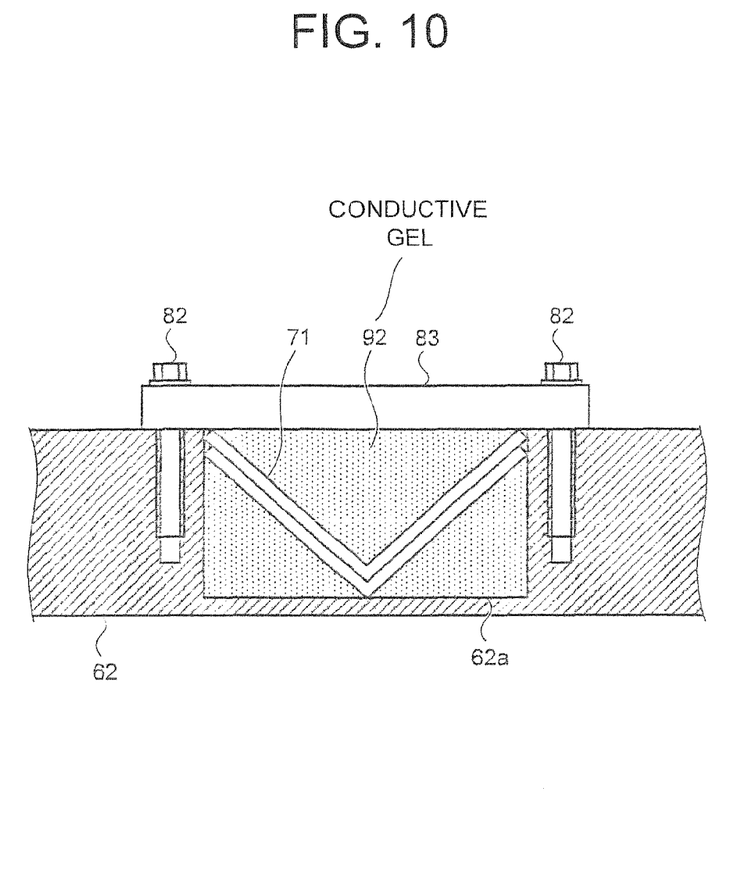

Embodiments related to the magnetic resonance imaging apparatus are not limited to this. Modifications of the magnetic resonance imaging apparatus according to the embodiment are explained below. FIGS. 9 and 10 are schematic diagrams for explaining modifications of the magnetic resonance imaging apparatus according to the embodiment.

For example, as shown in FIG. 9, by using a lid unit 83 that covers the pocket 61a of the shim tray 61, in a state that the iron shims 71 are accommodated in the pocket 61a and the pocket 61a is covered by the lid unit 83, an inflatable body 91 can be loaded between the iron shim 71 and the lid unit 83. The inflatable body 91 is, for example, a balloon, and configured to be inflated with a gas, such as air, or a fluid, such water.

By inflating the inflatable body 91, the iron shims 71 are extended in the longitudinal direction of the pocket 61a, and the ends of each of the iron shims 71 are pressed against the inner walls of the pocket. Simultaneously, the bent convex 71a of the iron shim 71 positioned at the bottom is pressed against the iron-shim fixing concave 61b. Accordingly, when the number of the iron shims 71 is few, each of the iron shims 71 can be stably fixed.

Alternatively, for example, as shown in FIG. 10, in a state that the iron shims 71 are accommodated in a pocket 62a and the pocket 62a is covered by the lid unit 83, conductive gel 92 can be filled inside the pocket 62a. In such case, a shim tray 62 in which the iron-shim fixing concave 61b is not formed is used. Accordingly, gaps produced between the iron shims 71 are filled with the conductive gel 92, so that potential differences arising between the iron shims 71 can be made small. Consequently, a discharge phenomenon occurring between the metal shim plates can be further suppressed, and noise appearing on an image can be more reduced.

Although the embodiment and the modifications are explained above in the cases where iron shims are used as metal shim plates, embodiments of the magnetic resonance imaging apparatus are not limited to this. For example, metal shim plates can be made from another material, such as permendur, or a magnetic steel plate.

Moreover, for example, metal shim plates can be each made from a shape memory alloy. In such case, the metal shim plates are made by bending a flat plate of a shape memory alloy. In this way, by making the metal shim plates from a shape memory alloy, when the gradient magnetic-field coil 20 generates heat while imaging, a force of returning to the state of a flat plate is generated on the metal shim plates with the heat. With the heat, the both ends of each of the metal shim plates are pressed against the inner walls of the pocket, so that each of the metal shim plates can be firmly fixed inside the pocket.

Furthermore, for example, a plurality of metal shim plates can be bonded to each other with an adhesive. Accordingly, the metal shim plates can be firmly fixed.

Moreover, for example, a plurality of metal shim plates can be fixed to each other with an insulating tape or a conductive tape. Accordingly, the metal shim plates can be electrically bonded, so that a discharge phenomenon occurring between the metal shim plates can be further suppressed. As a result, noise appearing on an image can be more securely reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
    a static magnetic-field generating unit configured to generate a static magnetic field in an imaging area in which a subject is to be placed;
    a gradient magnetic-field generating unit configured to generate a gradient magnetic field in the static magnetic field;
    a plurality of metal shim plates configured to adjust uniformity of the static magnetic field; and
    a shim holding unit configured to hold the metal shim plates in a layered state, wherein each of the metal shim plates includes convex and concave opposing surfaces, and the metal shim plates are layered in a stacked manner such that the convex surface of one metal shim plate comes into contact with the concave surface of another metal shim plate when said metal shim plates are stacked inside the shim holding unit.

2. The magnetic resonance imaging apparatus according to claim 1, wherein the metal shim plates are made from a shape memory alloy.

3. The magnetic resonance imaging apparatus according to claim 1, wherein the metal shim plates are bonded to each other with an adhesive.

4. The magnetic resonance imaging apparatus according to claim 2, wherein the metal shim plates are bonded to each other with an adhesive.

5. The magnetic resonance imaging apparatus according to claim 1, wherein the metal shim plates are fixed to each other with one of an insulating tape and a conductive tape.

6. The magnetic resonance imaging apparatus according to claim 2, wherein the metal shim plates are fixed to each other with one of an insulating tape and a conductive tape.

7. The magnetic resonance imaging apparatus according to claim 3, wherein the metal shim plates are fixed to each other with one of an insulating tape and a conductive tape.

8. The magnetic resonance imaging apparatus according to claim 1, wherein:
    the shim holding unit includes a pocket configured to accommodate the metal shim plates, and a lid unit configured to cover the pocket, and
    the shim holding unit is loaded with an inflatable body configured to be inflated with a gas or a fluid between the metal shim plate and the lid unit in a state that the metal shim plates are accommodated in the pocket and the pocket is covered by the lid unit.

9. The magnetic resonance imaging apparatus according to claim 2, wherein:
    the shim holding unit includes a pocket configured to accommodate the metal shim plates, and a lid unit configured to cover the pocket, and the shim holding unit is loaded with an inflatable body configured to be inflated with a gas or a fluid between the metal shim plates and the lid unit in a state that the metal shim plates are accommodated in the pocket and the pocket is covered by the lid unit.

10. The magnetic resonance imaging apparatus according to claim 3, wherein:
the shim holding unit includes a pocket configured to accommodate the metal shim plates, and a lid unit configured to cover the pocket, and
the shim holding unit is loaded with an inflatable body configured to be inflated with a gas or a fluid between the metal shim plates and the lid unit in a state that the metal shim plates are accommodated in the pocket and the pocket is covered by the lid unit.

11. The magnetic resonance imaging apparatus according to claim 4, wherein:
the shim holding unit includes a pocket configured to accommodate the metal shim plates, and a lid unit configured to cover the pocket, and
the shim holding unit is loaded with an inflatable body configured to be inflated with a gas or a fluid between the metal shim plates and the lid unit in a state that the metal shim plates are accommodated in the pocket and the pocket is covered by the lid unit.

12. The magnetic resonance imaging apparatus according to claim 5, wherein:
the shim holding unit includes a pocket configured to accommodate the metal shim plates, and a lid unit configured to cover the pocket, and
the shim holding unit is loaded with an inflatable body configured to be inflated with a gas or a fluid between the metal shim plates and the lid unit in a state that the metal shim plates are accommodated in the pocket and the pocket is covered by the lid unit.

13. The magnetic resonance imaging apparatus according to claim 6, wherein:
the shim holding unit includes a pocket configured to accommodate the metal shim plates, and a lid unit configured to cover the pocket, and
the shim holding unit is loaded with an inflatable body configured to be inflated with a gas or a fluid between the metal shim plates and the lid unit in a state that the metal shim plates are accommodated in the pocket and the pocket is covered by the lid unit.

14. The magnetic resonance imaging apparatus according to claim 1, wherein:
the shim holding unit includes a pocket configured to accommodate the metal shim plates, and a lid unit configured to cover the pocket, and
the shim holding unit is loaded with a conductive gel in the pocket in a state that the metal shim plates are accommodated in the pocket and the pocket is covered by the lid unit.

15. The magnetic resonance imaging apparatus according to claim 2, wherein:
the shim holding unit includes a pocket configured to accommodate the metal shim plates, and a lid unit configured to cover the pocket, and
the shim holding unit is loaded with a conductive gel in the pocket in a state that the metal shim plates are accommodated in the pocket and the pocket is covered by the lid unit.

16. The magnetic resonance imaging apparatus according to claim 3, wherein:
the shim holding unit includes a pocket configured to accommodate the metal shim plates, and a lid unit configured to cover the pocket, and
the shim holding unit is loaded with a conductive gel in the pocket in a state that the metal shim plates are accommodated in the pocket and the pocket is covered by the lid unit.

17. The magnetic resonance imaging apparatus according to claim 4, wherein:
the shim holding unit includes a pocket configured to accommodate the metal shim plates, and a lid unit configured to cover the pocket, and
the shim holding unit is loaded with a conductive gel in the pocket in a state that the metal shim plates are accommodated in the pocket and the pocket is covered by the lid unit.

18. The magnetic resonance imaging apparatus according to claim 5, wherein:
the shim holding unit includes a pocket that accommodates the metal shim plates, and a lid unit that covers the pocket, and
the shim holding unit is loaded with a conductive gel in the pocket in a state that the metal shim plates are accommodated in the pocket and the pocket is covered by the lid unit.

19. The magnetic resonance imaging apparatus according to claim 6, wherein:
the shim holding unit includes a pocket that accommodates the metal shim plates, and a lid unit that covers the pocket, and
the shim holding unit is loaded with a conductive gel in the pocket in a state that the metal shim plates are accommodated in the pocket and the pocket is covered by the lid unit.

20. A shimming apparatus comprising:
a plurality of metal shim plates configured to adjust uniformity of a static magnetic field of a magnetic resonance imaging apparatus; and
a shim holding unit configured to hold the metal shim plates in a layered state,
wherein each of the metal shim plates includes concave and convex opposing surfaces and the metal shim plates are layered in a stacked manner such that the convex surface of one metal shim plate comes into contact with the concave surface of another metal shim plate when said metal shim plates are stacked inside the shim holding unit.

* * * * *